United States Patent [19]

Curtis et al.

[11] 4,421,593
[45] Dec. 20, 1983

[54] REVERSE ETCHING OF CHROMIUM

[75] Inventors: Bernard J. Curtis, Gattikon; Martin Ebnoether, Birmensdorf, both of Switzerland

[73] Assignee: RCA Corporation, New York, N.Y.

[21] Appl. No.: 483,876

[22] Filed: Apr. 11, 1983

[51] Int. Cl.$^3$ .............................. C23F 1/02; B44C 1/22; C03C 15/00; C03C 25/06

[52] U.S. Cl. ................................. 156/643; 156/646; 156/650; 156/656; 156/659.1; 204/192 EC; 204/192 E; 252/79.1; 252/79.2; 427/38; 430/313; 430/318

[58] Field of Search ............ 204/164, 192 EC, 192 E, 204/298; 156/643, 646, 650, 655, 656, 659.1, 664; 427/38, 39; 252/79.1, 79.2; 430/313, 317, 318

[56] References Cited

U.S. PATENT DOCUMENTS 3,640,812 2/1972 Vossen, Jr. et al. ................. 204/192
3,692,655 9/1972 Vossen, Jr. .......................... 204/192

OTHER PUBLICATIONS

Yamazaki et al., *Japanese Journal of Applied Physics*, vol. 19, No. 7, Jul. 1980, pp. 1371–1376.
Vossen et al., *Pure and Appl. Chem.*, vol. 52, pp. 1759–1765, (1980).
Busta et al., *Industrial Research and Development*, Jun. 1978, pp. 133–142.

Primary Examiner—William A. Powell
Attorney, Agent, or Firm—Birgit E. Morris; R. Hain Swope

[57] ABSTRACT

A process for reverse etching a layer of chromium on a substrate is provided wherein a layer of resist is formed on the chromium and developed, thus exposing a portion of the chromium. The exposed chromium is passivated by backscattering from a suitable backing plate in a plasma, the resist is removed and the unpassivated chromium etched with a conventional liquid etchant. The pattern formed in the chromium layer is the opposite of that original formed in the resist material.

16 Claims, No Drawings

REVERSE ETCHING OF CHROMIUM

This invention relates to the etching of a chromium layer on a substrate. More particularly, this invention relates to a process of reverse etching such a chromium layer, e.g. using a positive resist to form a negative pattern therein.

BACKGROUND OF THE INVENTION

Patterned layers of chromium deposited on transparent substrates are widely used as photolithographic masks. For this use, chromium layers are predominately patterned with a negative resist material when fine definition, complex patterns are required. For certain applications, however, chromium layers can be patterned with a positive resist material. There is, of course, a need to increase the resolution of such masks to satisfy the ongoing demand in the electronics industry for more minute, more complex circuitry and devices. To this end, it would be advantageous to be able to produce fine, complex patterns in such chromium layers with a positive resist material instead of the predominately utilized negative resist materials.

A process of utilizing a photoresist material to pattern a chromium layer with a pattern opposite to that in the resist material, i.e. reverse etch the chromium, has been described by Yamazaki et al. in the *Japanese Journal of Applied Physics*, Vol. 19, No. 7, July 1980, pp. 1374–1376. This process involved doping a chromium oxide layer as it was being deposited onto the chromium. The source of chromium oxide being heat evaporated onto the chromium was contained in a tungsten boat and, hence, tungsten, as its oxide, was carried along as an impurity.

Yamazaki et al. discovered that, when a patterned positive photoresist formed on the chromium oxide was plasma etched, the tungsten oxide impurity underlying the photoresist was removed. As etching continued, both the oxide and the underlying chromium were etched away, but that portion of the chromium oxide not covered by the photoresist was resistant to the etchant. The passivating capacity of the tungsten impurity, therefore, caused the original pattern in the positive photoresist to be reversed in the chromium layer, as if it had been directly patterned with a negative resist material. It will be appreciated that, had the photoresist been negative-working, the pattern produced in the chromium layer would be as if it had been directly patterned with a positive resist material.

In accordance with this invention, there is provided a precise process of reverse etching a chromium layer utilizing wet etching of the chromium which is considerably faster and less expensive than dry etching techniques.

SUMMARY OF THE INVENTION

In accordance with this invention, there is provided a process of reverse etching a chromium layer wherein chromium exposed by development of a resist material is passivated to wet chemical etching by back sputtering a layer of passivant thereon.

DETAILED DESCRIPTION OF THE INVENTION

The process of this invention is principally intended for the etching of chromium layers formed on transparent substrates such as glass. However, any substrate which is impervious to conventional liquid etchants for chromium could be utilized.

The chromium layers etched in accordance with this invention are generally relatively thin, e.g. 0.5 micrometer or less. For photomask use, layers of chromium formed on a transparent substrate are generally about 50 to 100 nanometers thick. Because the chromium layers are very thin, undercutting is not considered to be a major problem in wet chemical etching, even with lines and spaces as small as 150 nm. The chromium layer may be bright or pure chromium or "black chrome", i.e. chromium covered with a thin layer of chromium oxide to reduce its surface reflectivity.

The chromium layer is initially coated with a layer of a positive resist material. A predetermined portion of the resist layer is irradiated, e.g. with ultraviolet light, x-rays or an electron beam. The irradiated portion of the resist layer is then removed with a solvent, i.e. wet development, or by plasma etching, i.e. dry development, thus exposing a corresponding portion of the surface of the chromium layer. In the instance of a negative resist material, the portion not irradiated would be removed during development.

The particular type of resist material, the type of irradiation, and the mode of development have no critical bearing on the subject process. It is important that the resist layer be compatible with and adhere well to the chromium layer, particularly during development. It is also important that none of the processing of the resist layer adversely affects the chromium layer in any way, i.e. the resist layer must be soluble in or etchable by an agent which does not attack the chromium layer. Suitable resist materials include, for example, poly(butenesulfone) and a novolac-type phenol-formaldehyde resin/photosensitive cross-linking agent composition available as AZ-1350 from the Shipley Company.

The resist material may be either positive or negative working, since both are used to pattern chromium, particularly in a vector type e-beam machine. A mask pattern with very large transparent areas would be prepared using a negative resist material and a mask with a very fine complex pattern would be formed with a positive resist material. These would, of course, be reversed in the subject method, i.e. a chromium mask having large transparent areas would be prepared with a positive-working resist and vice versa. Generally, it is preferred to utilize a positive resist material in the method of the subject invention.

The exposed portion of the chromium layer is now passivated by the known technique of back-scattering. The substrate is placed on a backing plate of suitable material in a conventional plasma generating apparatus and plasma treated for a time less than that required to remove the remaining resist layer, but sufficient to deposit a passivating coating of the backing plate material onto the exposed chromium.

The plasma treating step can be carried out in any conventional apparatus, preferably a parallel plate reactor such as described by Vossen in an article entitled, "Plasma Deposition and Etching Reactors for Semiconductor Applications" in *Pure and Appl. Chem.*, Vol. 52, pp. 1759–1965 (1980). The backing plate is placed on the powered electrode and, preferably, conforms to the dimensions thereof. It is, of course, critical that the backing plate have a surface area larger than the substrate so that back-scattering can occur. The etching times, voltage and gas pressure in the reactor are not particularly critical to the subject process and can be adjusted in keeping with the criteria stated herein.

It is necessary that the plasma treatment be halted before the remaining resist layer has been removed to prevent passivation over the entire surface of the chromium. The etch rates of various resist materials in a given plasma are either known or easily determined. With the etch rate and the thickness of the resist layer in hand, a suitable stopping point for the plasma treatment is readily calculated. Routine experimentation will then indicate whether the passivation layer deposited on the exposed chromium is adequate to protect it during etching.

It is also possible to monitor the erosion of the resist material by, for example, laser interference as described by Busta et al., *Industrial Research and Development*, June 1978, pages 133-142. This method will also indicate that resist material remains after the plasma treatment.

The backing plate material can be any material which is resistant to the liquid etchants conventionally utilized to etch chromium, such as, for example, silicon dioxide, niobium, tantalum and the like. A preferred material is silicon dioxide. One of ordinary skill in the art can readily determine by routine experimentation whether a given material is suitable for the process of this invention. The backing plate may be pure material or may be a support with the desired passivant coated thereon. The thickness of the backing plate or the coating thereon is not critical so long as there is sufficient passivant material available to form the desired coating on the exposed chromium layer. For most applications, the passivant coating or backing plate should have a thickness of at least about 2 millimeters.

The plasma gas must be one that is inert to the chromium layer. Preferred plasma gases include oxygen, argon and sulfur hexafluoride. It is also important that the plasma gas not etch the resist too rapidly in relation to the deposition of the passivation layer on the exposed chromium. For example, in a reactive ion etching system with a power density of 0.3 watts/cm$^2$ and a pressure of 25 mtorr., the Shipley Co. resist AZ-1350 is removed at a rate of 160 nm/min. in an oxygen plasma and 50 nm/min. in a sulfur hexafluoride plasma. Those of ordinary skill in the art will appreciate that parameters such as the power, pressure, the treatment gas and the like can be varied without departing from the scope of this invention.

It will also be appreciated that, utilizing a dry developable resist, development of the resist and passivation may be carried out in the same apparatus simply by changing the plasma mixture and/or the conditions.

After completion of the plasma treatment, the remaining resist layer is removed from the chromium layer. While it is possible to remove the resist with a plasma, it is preferred to utilize a solvent to dissolve it. The choice of a solvent will depend on the resist utilized. It will be appreciated that it is necessarily a criteria in choosing a resist that it can be effectively removed by a solvent or plasma which is comparatively inert to both the chromium layer and the passivating coating thereon. The removal of the remaining resist leaves only a passivating coating on that portion of the chromium layer originally exposed by development of the positive resist.

The exposed chromium layer is then etched by wet etching utilizing a conventional etching solution. The choice of an etching solution is limited only by the requirement that it be inert to both the substrate and the passivating layer. A preferred etching solution for the chromium layer is an aqueous solution of ceric ammonium sulfate or nitrate and concentrated sulfuric acid. This solvent is advantageous because the ceric salts, particularly the nitrate, are not regarded as environmental contaminates. The advantages of the wet etch procedure are speed, one to three minutes vs. about 30 minutes for plasma etching, cost, and being amenable to large batch processing.

The passivating coating may then be removed leaving the chrome mask. A passivating layer of silicon dioxide may be removed by plasma etching using a conventional fluorocarbon etch mixture. Although this will also etch a glass substrate, the passivating coating will be removed before significant etching of the glass has taken place. Other passivating substances would be removed by whatever conventional methods are known in the art, so long as neither the chromium nor the glass substrate were appreciably attacked during removal. It may be advantageous in certain instances to leave the passivating coating on the chromium so long as it does not interfere with further processing. For example, it is often difficult to precisely align a mask of bright chromium because of its high reflectivity. The presence of the passivating layer can negate reflectivity and facilitate alignment.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

Glass plates 5×5 cm having a 40 nm thick layer of chromium were utilized as substrates. A layer of positive resist material, AZ-1350 of the Shipley Co., was spin-coated onto the chromium to a thickness of 200 nm. A pattern of 150 nm lines and spaces was formed in the resist layer by irradiation with electron beam utilizing a scanning electron microscope equipped with a microprocessor. The resist was developed with Shipley AZ developer which removed selected portions of the resist layer thereby exposing corresponding portions of the chromium layer.

Samples of the resulting substrates were placed into a conventional parallel plate plasma chamber. The substrates were divided and plasma treated in an oxygen plasma, an argon plasma and a sulfur hexafluoride plasma, respectively, under the following conditions:

| | Plasma | | |
| --- | --- | --- | --- |
| | Oxygen | Argon | SF$_6$ |
| Pressure (mtorr) | 20 | 20 | 25 |
| Flowrate (scc/min.) | 15 | 30 | 10 |
| Power (watts/cm$^{-2}$) | 0.57 | 0.9 | 0.15 |
| Time (seconds) | 40 | 120 | 210 |

Each substrate was placed on a 0.5 cm thick backing plate of silicon dioxide 15 cm in diameter. The backing plate was placed on the powered electrode.

In each instance, the plasma treatment was monitored by laser interference according to the method of Busta et al. The treatment was terminated before the resist layer was completely eroded. The substrates were then treated to remove the remaining resist by immersion in acetone under ultrasonic agitation for two minutes.

The substrates were then immersed for two minutes in an aqueous etching bath containing, in each liter, 28 ml of 96 percent sulfuric acid and 64 g of ceric ammonium sulfate dihydrate. After rinsing, the substrates were examined. The chromium remaining thereon was in the exact configuration of the pattern originally formed in the resist material. The passivating layer was removed by plasma etching in a trifluoromethane plasma.

EXAMPLE 2

The procedure of Example 1 was repeated utilizing a backing plate of pure niobium and argon as the passivating plasma. After completion of the plasma passivation treatment and stripping of the remaining resist, microprobe analysis found niobium in that portion of the chromium layer which had been exposed to the argon plasma but no niobium in that portion of the chromium layer protected by the resist. Wet etching produced a negative chromium-on-glass configuration as in Example 1.

EXAMPLE 3

The procedure of Example 1 was repeated utilizing a substrate having a 10 nm thick coating of chromium oxide sputtered onto the chromium. To further establish that the present method of passivation occurs through backscattering from the backing plate, oxygen was utilized as the passivating plasma.

A pattern comparable to that of Example 1 was obtained. It was noted that passivation of this substrate was significantly more efficient than that for bright chromium in terms of the etch rate of passivated vs. unpassivated surfaces. The explanation for this is not known.

We claim:

1. A process of reverse etching a layer of chromium on a substrate comprising:
   (a) forming a layer of resist material on the chromium layer;
   (b) irradiating and developing the resist layer thereby exposing a portion of the chromium layer;
   (c) plasma treating an assembly comprising said substrate and a backing plate comprised of a material resistant to liquids capable of etching chromium for a time sufficient to form a passivating coating on the exposed chromium by back-scattering material from said backing plate, but insufficient to remove all of said resist material;
   (d) removing the remaining resist material, thus exposing the unpassivated portion of the chromium layer; and
   (e) etching the unpassivated chromium layer with a liquid etchant.

2. A process in accordance with claim 1, additionally including the step of removing said passivating coating.

3. A process in accordance with claim 1, wherein the resist material is a positive resist material.

4. A process in accordance with claim 1, wherein the irradiated portion of the resist layer is wet developed with a suitable solvent.

5. A process in accordance with claim 1, wherein the irradiated portion of the resist layer is dry developed in a plasma substantially inert with regard to the chromium.

6. A process in accordance with claim 1, wherein the plasma in step (c) is selected from the group consisting of oxygen, argon and sulfur hexafluoride plasmas.

7. A process in accordance with claim 6, wherein said plasma is an oxygen plasma.

8. A process in accordance with claim 6, wherein said plasma is an argon plasma.

9. A process in accordance with claim 1, wherein said backing plate is silicon dioxide.

10. A process in accordance with claim 1, wherein said backing plate is niobium.

11. A process in accordance with claim 1, wherein the resist is removed in step (d) by plasma etching in a plasma inert to the passivated and unpassivated portions of the chromium layer.

12. A process in accordance with claim 1, wherein the resist is removed in step (d) with a solvent substantially inert to the passivated and unpassivated portions of the chromium layer.

13. A process in accordance with claim 1, wherein the unpassivated chromium is etched with an aqueous solution of a ceric ammonium salt and sulfuric acid.

14. A process in accordance with claim 13, wherein said salt is ceric ammonium nitrate.

15. A process in accordance with claim 13, wherein said salt is ceric ammonium sulfate.

16. A process in accordance with claim 9, wherein the passivating coating is removed by etching in a fluorocarbon plasma.

* * * * *